US008499998B2

(12) United States Patent
Wada et al.

(10) Patent No.: US 8,499,998 B2
(45) Date of Patent: Aug. 6, 2013

(54) COMPONENT BUILT-IN CIRCUIT SUBSTRATE AND METHOD OF PRODUCING THE SAME

(75) Inventors: Yoshiyuki Wada, Fukuoka (JP); Tadahiko Sakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 457 days.

(21) Appl. No.: 12/576,572

(22) Filed: Oct. 9, 2009

(65) Prior Publication Data

US 2010/0089628 A1    Apr. 15, 2010

(30) Foreign Application Priority Data

Oct. 15, 2008    (JP) .................................. 2008-265974

(51) Int. Cl.
*B23K 31/02*    (2006.01)
*H01L 21/70*    (2006.01)

(52) U.S. Cl.
USPC .................. 228/122.1; 228/123.1; 228/124.5; 413/329; 413/330; 413/382; 413/612

(58) Field of Classification Search
USPC .................. 228/122.1, 123.1, 124.5; 438/329, 438/330, 382, 612
See application file for complete search history.

(56) References Cited

U.S. PATENT DOCUMENTS

| 6,548,341 B2 * | 4/2003 | Sarstedt ......................... 438/239 |
| 6,915,944 B1 | 7/2005 | Takaya et al. |
| 2003/0168254 A1 * | 9/2003 | Kariya et al. ................. 174/261 |
| 2006/0273461 A1 | 12/2006 | Otsuka |
| 2007/0175969 A1 * | 8/2007 | Wada et al. ................. 228/180.1 |

FOREIGN PATENT DOCUMENTS

| CN | 1873970 A | 12/2006 |
| JP | 06-021633 A | 1/1994 |
| JP | 2000-031187 A | 1/2000 |
| JP | 2001-170798 A | 6/2001 |
| JP | 2002-237682 A | 8/2002 |
| JP | 2006-093493 A | 4/2006 |
| JP | 2006-173337 A | 6/2006 |
| JP | 2006-286851 A | 10/2006 |
| JP | 2006-310421 A | 11/2006 |
| JP | 2007-035689 A | 2/2007 |
| JP | 2007-214230 A | 8/2007 |
| JP | 2008-166720 A | 7/2008 |
| JP | 2008-265974 | 11/2010 |

* cited by examiner

*Primary Examiner* — Keith Walker
*Assistant Examiner* — Erin Saad
(74) *Attorney, Agent, or Firm* — RatnerPrestia

(57) ABSTRACT

A core layer has on its front surface a pair of connecting electrodes forming a wiring pattern and a resist formed between the pair of electrodes; an electronic component having a pair of connecting terminals; a solder part joining between electrodes and connecting terminals; and a sealing resin part filling a gap between the bottom surface of the electronic component and the front surface of the core layer and covering the resist and the solder part, to prevent a defect of a component built-in printed circuit substrate.

7 Claims, 5 Drawing Sheets

COMPONENT BUILT-IN CIRCUIT SUBSTRATE AND METHOD OF PRODUCING THE SAME

BACKGROUND OF THE INVENTION

1. Field of the Invention

The present invention relates to a component built-in circuit substrate formed by laminating plural wiring layers, where electronic components are mounted on the core layer (i.e. an inner layer out of the wiring layers), and to a method of producing the component built-in circuit substrate.

2. Background Art

With higher functionality and downsizing of electronic devices in recent years, higher packaging density tends to be demanded in a substrate with electronic components mounted thereon. Accordingly, as a printed circuit substrate used for mounting electronic components, what is called a component built-in circuit substrate is used, where electronic components are mounted on an inner layer (core layer) out of plural laminated wiring layers (refer to patent literature 1 for example). Patent literature 1 shows an example where a chip component (electronic component with a pair of terminals) such as a chip capacitor is mounted on an inner layer out of plurally provided wiring layers in a printed circuit substrate. Here, the terminal of a chip component is soldered to a mounting land with a solder resist formed therearound in the inner layer, and a solder resist unformed part is provided between adjacent mounting lands.

In patent literature 1, however, the following disadvantages occur caused by a solder resist being formed in an exposed state and by a range in which the solder resist is formed. Specifically, in producing a component built-in circuit substrate with plural wiring layers laminated thereon, an inner layer after components are mounted thereon needs to undergo roughening process to improve adhesion between an interlayer insulating layer and the inner layer. The roughening process is performed with a chemical solution such as strong acid and strong alkali, which inevitably damages a solder resist in its exposed state. In laminating and heating process for forming an interlayer insulating layer, imperfect filling is likely to occur in which resin does not completely enter a solder resist unformed part between mounting lands. If reheating is executed to mount an electronic component onto an outer layer with the imperfect filling remaining, a defect such as a bridge (solder for joining terminals together is remelted to short-circuit between the terminals). In this way, a conventional component built-in circuit substrate with a chip component contained causes various kinds of defects resulting from a shape in which a solder resist is formed.

[Prior Art Document]
[Patent Literature]
[Patent literature 1] Japanese Patent Unexamined Publication No. 2007-214230

SUMMARY OF THE INVENTION

The present invention provides a component built-in circuit substrate incorporating electronic components with connecting terminals, capable of preventing defects, and a method of producing the component built-in circuit substrate.

A component built-in circuit substrate of the present invention includes: a core layer with a wiring pattern formed on its front surface, with an electronic component having a pair of connecting terminals mounted thereon; a component fixing layer formed on the front surface of the core layer, fixing the electronic component; a wiring layer with another wiring pattern formed thereon, placed on the front surface of the component fixing layer; and an interlayer wiring part connecting the wiring pattern of the core layer to the other wiring pattern of the wiring layer. The core layer includes: a pair of connecting electrodes forming the wiring pattern; a solder part joining between the pair of connecting electrodes and the pair of connecting terminals; a resist formed between the pair of electrodes; and a sealing resin part filling a gap to the bottom surface of the electronic component, covering the resist and the solder part. The component fixing layer fixes the electronic component and the sealing resin part at their peripheries.

The method of producing a component built-in circuit substrate, of the present invention includes: a step of feeding solder-joining material produced from thermosetting resin containing solder particles, to a pair of connecting electrodes forming a wiring pattern, that are on the front surface of the core layer and have a resist formed therebetween; a step of then fastening a pair of connecting terminals of an electronic component having the pair of connecting terminals, to the pair of electrodes through the solder-joining material, respectively, to mount the electronic component on the core layer; a step of then forming a sealing resin part covering the resist and the solder part by heating the core layer to melt and solidify the solder particles to form a solder part joining between the electrodes and the connecting terminals, and by thermally hardening the thermosetting resin to fill a gap between the bottom surface of the electronic component and the front surface of the core layer; a step of then forming a component fixing layer fixing the electronic component, on the front surface of the core layer; a step of then providing a wiring layer with another wiring pattern formed thereon on the front surface of the component fixing layer; and a step of then forming an interlayer wiring part connecting the wiring pattern of the core layer to the other wiring pattern of the wiring layer.

Such a structure includes a resist formed between a pair of electrodes and a sealing resin part covering the resist and a solder part joining the electrodes and terminals. Consequently, defects of a component built-in circuit substrate can be prevented such as damage to a solder part and a resist in roughening process executed for the core layer after electronic components are mounted, and short circuit between electrodes caused by a flow of melted solder produced from the solder part remelted in reheating when electronic components are mounted on the outer layer.

DETAILED DESCRIPTION OF PREFERRED EMBODIMENT

Hereinafter, a description is made of an exemplary embodiment of the present invention with reference to the related drawings. The present invention is not limited to the embodiment.

Figure 1A:
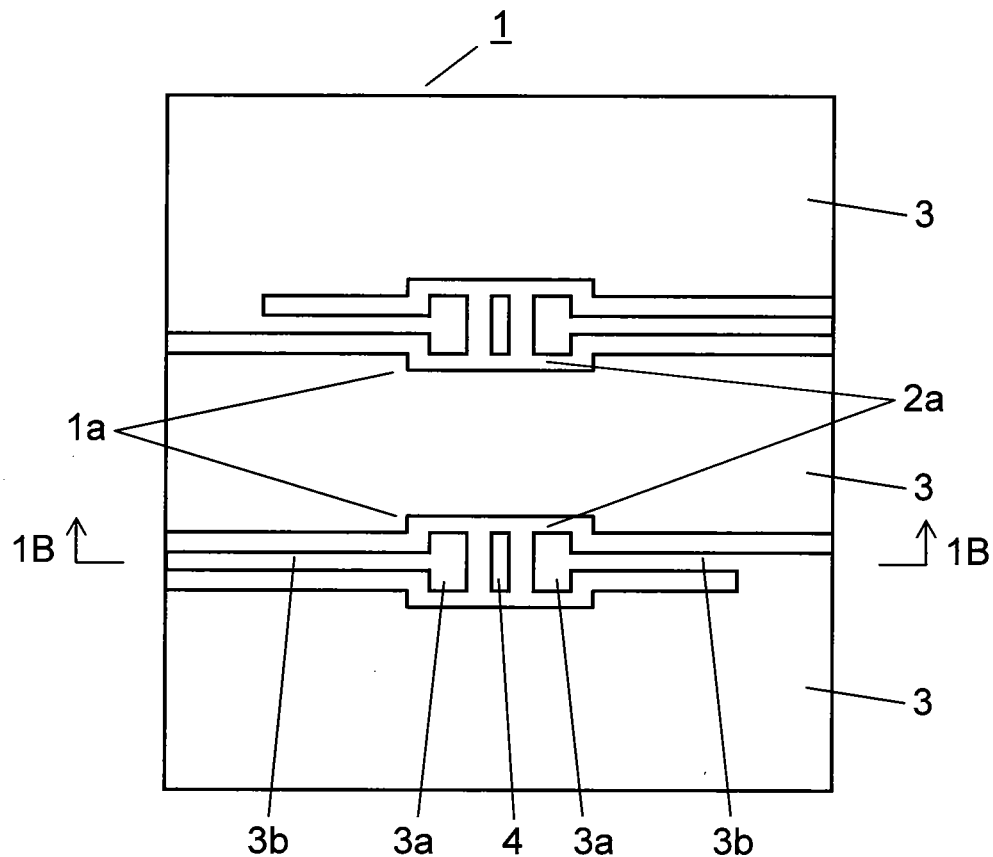
FIG. 1A is a plan view illustrating the structure of the core layer of a component built-in circuit substrate according to an exemplary embodiment of the present invention.
Figure 1B:
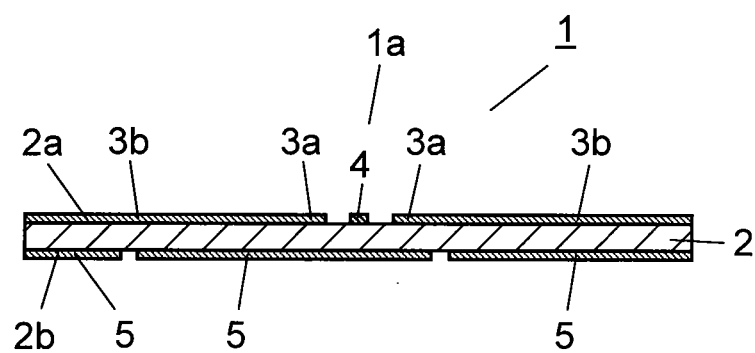
FIG. 1B is a sectional view taken along line 1B-1B, of the component built-in circuit substrate according to the embodiment of the present invention.
Figure 2:
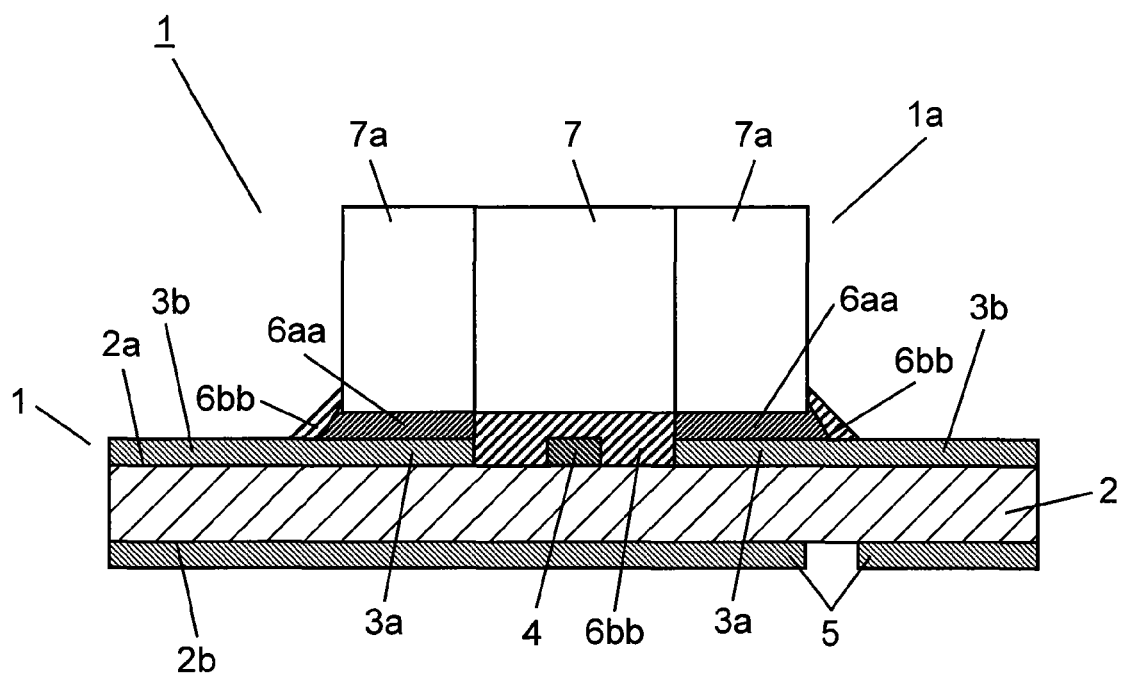
FIG. 2 is a sectional view of the component mounted part of the core layer of the component built-in circuit substrate according to the embodiment of the present invention.
Figure 3:
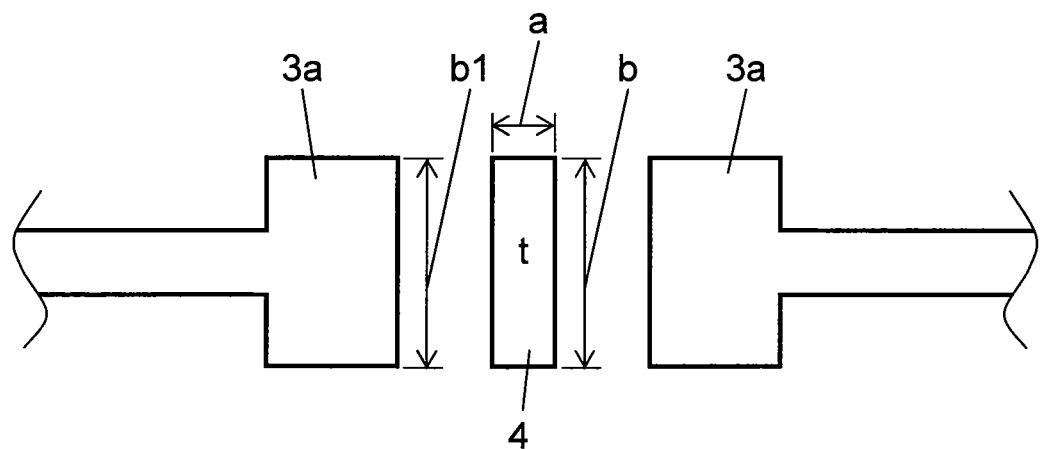
FIG. 3 is a plan view showing electrodes and a resist of the component built-in circuit substrate according to the embodiment of the present invention.

FIG. 1A is a plan view illustrating the structure of the core layer of a component built-in circuit substrate according to an exemplary embodiment of the present invention. FIG. 1B is a sectional view of FIG. 5A taken along line 1B-1B. FIG. 2 is a sectional view of the component mounted part of the core layer of the component built-in circuit substrate according to the embodiment of the present invention. FIG. 3 is a plan view showing electrodes and a resist of the component built-in circuit substrate according to the embodiment of the present invention.

This embodiment targets a component built-in circuit substrate formed by laminating plural wiring layers including the core layer as a base, having an electronic component (abbreviated to "chip component" hereinafter) with a pair of connecting terminals mounted on the core layer. First, the structure of core layer 1 is described in reference to FIGS. 1A, 1B.

In FIGS. 1A, 1B, core layer 1 has wiring pattern 3 and wiring pattern 5 formed on top surface 2a and bottom surface 2b of insulative resin substrate 2, respectively. Top surface 2a of resin substrate 2 is a built-in component mounting surface on which an electronic component contained in the component built-in circuit substrate is mounted. Top surface 2a has wiring pattern 3 formed wholly thereon made of conductive metal such as copper foil. Wiring pattern 3 is provided with component mounted part 1a for mounting a chip component on core layer 1 (refer to the cross section taken along line 1B-1B). Component mounted part 1a is formed by partially patterning thin film forming wiring pattern 3.

In component mounted part 1a, thin film forming wiring pattern 3 is partially removed, and a part where top surface 2a of resin substrate 2 is exposed has a pair of electrodes 3a formed thereon. FIG. 2 is a sectional view showing core layer 1 with a chip component mounted thereon. Electrodes 3a have a pair of terminals 7a of chip component 7 joined thereto. Each electrode 3a has lead part 3b extending therefrom connecting to another wiring pattern. In other words, electrode 3a composes wiring pattern 3 formed on at least one surface (top surface 2a) of core layer 1.

In FIG. 2, electrode 3a and terminal 7a of chip component 7 have solder part 6aa formed therebetween from solder particles 6a contained in the solder-joining material melting and solidified. Solder part 6aa joins electrode 3a and terminal 7a of chip component 7 together. The gap between bottom surface of chip component 7 and the front surface of core layer 1 has sealing resin part 6bb formed therein from thermosetting resin 6b contained in the solder-joining material thermally hardened so as to cover the periphery of solder part 6aa and resist 4. In this embodiment, resist 4 including its side and top surface is completely covered with sealing resin part 6bb.

In a part where top surface 2a is exposed (refer to FIGS. 1A, 1B), a pair of electrodes 3a have resist 4 formed halfway therebetween made of insulative resin. Resist 4 is formed in a rectangular shape of film as shown in FIG. 1A in a planar view. Resist 4 is formed in length a (the distance along the direction of a pair of electrodes 3a facing each other), width b (the distance along the direction orthogonal to that of a pair of electrodes 3a facing each other), and thickness t as shown in FIG. 3.

Resist 4, as described later, blocks a flow of a melted solder part formed to solder-join a chip component to electrode 3a in reheating when solder-joining an electronic component to completed component built-in circuit substrate 17 (refer to FIGS. 5A through 5C) for surface mounting, to prevent a solder bridge causing short circuit of a pair of electrodes 3a from occurring.

For this purpose, width b of resist 4 is set to a value larger than width b1 (refer to FIG. 3) of electrode 3a so as to block melted solder flowing from electrode 3a effectively. In this embodiment, an example where width b is set to a value equal to width b1 is shown. Thickness t is set to a value large enough to ensure blocking flowing melted solder. In other words, resist 4 is positioned halfway between a pair of electrodes 3a and is formed in a range corresponding to the width of electrode 3a in core layer 1.

Figure 4A:
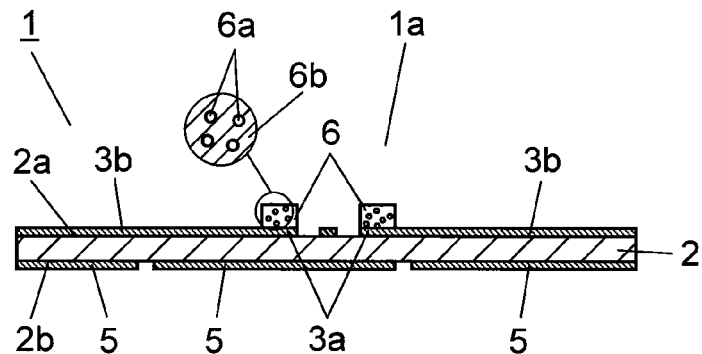
FIG. 4A is an explanatory process drawing showing a method of producing a component built-in circuit substrate according to the embodiment of the present invention.
Figure 4B:
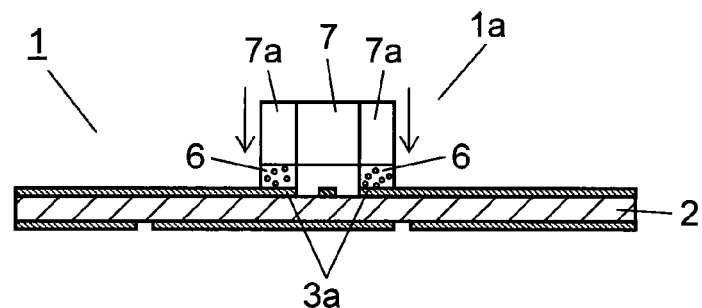
FIG. 4B is an explanatory process drawing showing a method of producing the component built-in circuit substrate according to the embodiment of the present invention.
Figure 4C:
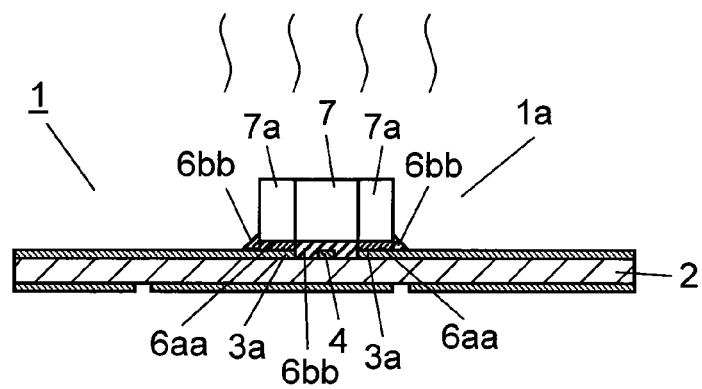
FIG. 4C is an explanatory process drawing showing the method of producing the component built-in circuit substrate according to the embodiment of the present invention.
Figure 4D:
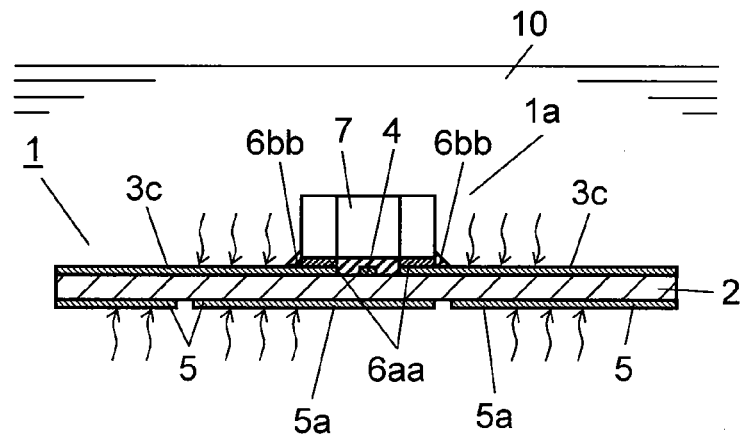
FIG. 4D is an explanatory process drawing showing the method of producing the component built-in circuit substrate according to the embodiment of the present invention.
Figure 5A:
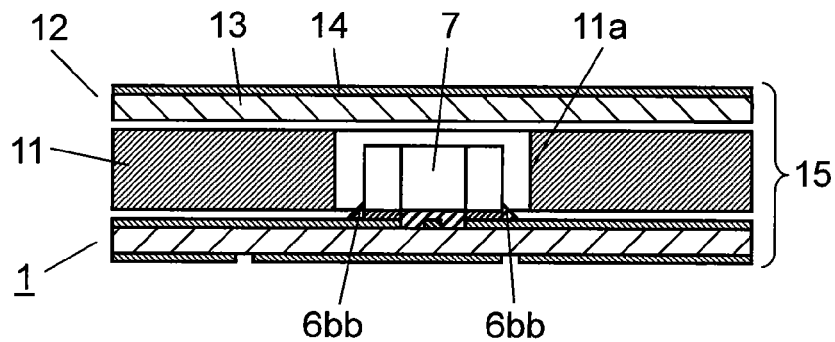
FIG. 5A is another explanatory process drawing showing the method of producing the component built-in circuit substrate according to the embodiment of the present invention.
Figure 5B:
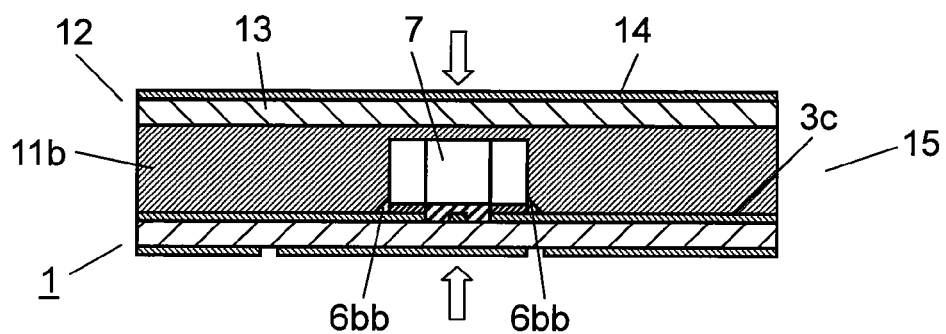
FIG. 5B is another explanatory process drawing showing the method of producing the component built-in circuit substrate according to the embodiment of the present invention.
Figure 5C:
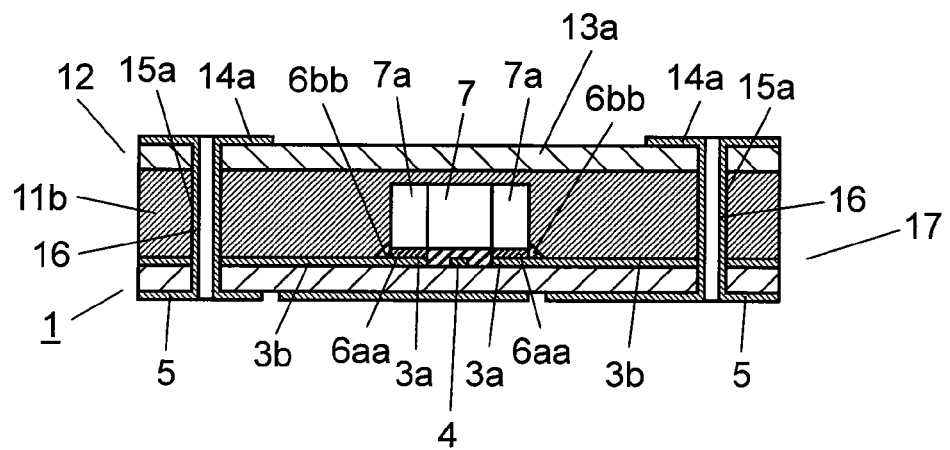
FIG. 5C is another explanatory process drawing showing the method of producing the component built-in circuit substrate according to the embodiment of the present invention.

Next, a description is made of a method of producing a component built-in circuit substrate formed with core layer 1 in reference to FIGS. 4A through s 4D and FIGS. 5A through 5C. FIGS. 4A through 4D are explanatory process drawings showing a method of producing a component built-in circuit substrate according to the embodiment of the present invention, where the process until chip component 7 is incorporated into core layer 1 is shown. FIGS. 5A through 5C are other explanatory process drawings showing the method of producing a component built-in circuit substrate according to the embodiment of the present invention, where the process of further forming a component fixing layer and a wiring layer is shown.

As shown in FIG. 4A, solder-joining material 6 is fed by a method such as screen printing and application by a dispenser onto connecting electrodes 3a forming wiring pattern 3 formed on at least one surface (top surface 2a) of core layer 1 (solder feed step). Solder joining material 6 is produced from thermosetting resin 6b containing solder particles 6a having activating effect (removing oxide film). Here, solder particles 6a are Sn-based solder particles containing 3.0% Ag and 0.5% Cu. Thermosetting resin 6b is bisphenol A epoxy resin. The epoxy resin has onium salt added therein as a hardening agent (activator).

After then, as shown in FIG. 4B, chip component 7 including a pair of terminals 7a at its both ends is incorporated to core layer 1 from the direction of the arrow after having undergone the solder feed step (solder-joining material 6 has been fed to electrode 3a), and then terminal 7a is mounted onto electrode 3a through solder-joining material 6 (component incorporation step). Subsequently, core layer 1 with chip component 7 mounted thereon is transferred to a reflow device. As shown in FIG. 4C, core layer 1 having components incorporated therein is heated to solder-join terminals 7a of chip component 7 to electrodes 3a (joining process).

In other words, in this joining process, solder particles 6a in solder-joining material 6 melt and solidify to form solder part 6aa that joins and electrically conducts electrode 3a with terminal 7a. Heating, along with this solder-joining, promotes flowing of thermosetting resin 6b in solder-joining material 6 due to a decrease in viscosity; and thermosetting reaction due to heating further continuing. With this flowing, thermosetting resin 6b enters and fills a gap between the front surface of core layer 1 and the bottom surface of chip component 7, namely a gap between top surface 2a of resin substrate 2 and the bottom surface of chip component 7 exposed in component mounted part 1a, to cover solder part 6aa joining electrode 3a to terminal 7a, and resist 4. Then, thermosetting resin 6b that has thermally hardened fills a gap between core layer 1 and the bottom surface of chip component 7 to form sealing resin part 6bb covering resist 4 and solder part 6aa.

In forming this sealing resin part 6bb, resist 4 positioned between a pair of electrodes 3a advantageously improves the filling rate when thermosetting resin 6b fills a gap between core layer 1 and the bottom surface of chip component 7. Specifically, resist 4 occupies a given volume defined by above-described length a, width b, and thickness t, and thus even if the amount of thermosetting resin 6b in solder-joining material 6 fed onto electrode 3a is insufficient for the volume of a gap to be filled, the deficit is advantageously covered. Hence, to determine length a, width b, and thickness t, estimation is made of the amount of thermosetting resin 6b feedable onto electrode 3a, and combination of dimensions is made so as to provide an enough volume to cover the deficit. For component 0603 for example, a combination of a=0.15 mm, b=0.3 mm, and t=0.01 mm is applied; for component 1005, a combination of a=0.3 mm, b=0.5 mm, t=0.01 mm is applied.

In this embodiment, if width b of resist 4 corresponds to width b1 of electrode 3a, namely width b is nearly equal to width b1, sealing resin part 6bb can completely cover resist 4.

After then, core layer 1 having undergone solder-joining process undergoes roughening process (roughening step). Specifically, as shown in FIG. 4D, immersing core layer 1 in process liquid 10 such as a strong acid solution roughens front surface 3c of wiring pattern 3 and front surface 5a of wiring pattern 5 due to oxidation, thereby forming an anchor pattern with minute asperities on these front surfaces. At this moment, solder part 6aa and resist 4 are completely covered and protected with sealing resin part 6bb formed in a gap between core layer 1 and the bottom surface of chip component 7, and thus the effect of roughening process does not reach solder part 6aa or resist 4 and keeps them undamaged.

After then, a component fixing layer and plural wiring layers for fixing chip component 7 are laminated on core layer 1. Specifically, as shown in FIG. 5A, wiring layers 12 in which copper foil 14 is stuck onto the front surface side of prepreg 11 provided with opening 11a correspondingly to the position of chip component 7 and the top surface side of prepreg 13 are sequentially overlaid on the top surface side (the side of chip component 7) of core layer 1. In other words, in core layer 1 having undergone the roughening process step, this step bonds together and laminate core layer 1; and prepreg 11 for forming a component fixing layer for fixing chip component 7 by enclosing its periphery, and plural wiring layers including at least wiring layer 12 formed on the front surface of the component fixing layer, to form laminated body 15 (laminating step).

Subsequently, as shown in FIG. 5B, laminated body 15 composed of core layer 1, prepreg 11, and wiring layer 12 is heated at approximately 150° C. to 200° C. while being pressurized by a press machine at approximately 30 kg/cm² (the outline arrow in FIG. 5B). Herewith, resin impregnated in each layer of prepreg 13, 11 softens to mutually fusion-bond interfaces contacting each other, and prepreg 11 closely contacts front surface 3c of wiring pattern 3. At this moment, a minute anchor pattern is formed on front surface 3c in the roughening process step, thereby ensuring favorable adhesion.

Further, resin impregnated in prepreg 13, 11 fills a gap between opening 11a and chip component 7 due to pressurizing and heating to form component fixing layer 11b fixing chip component 7 and sealing resin part 6bb at their peripheries. More specifically, this step heats and pressurizes laminated body 15 formed in the laminating step to form component fixing layer 11b fixing chip component 7 by enclosing its periphery, and fastens core layer 1 to wiring layer 12 (press working step). This heating and pressurizing thermally hardens prepreg 13 in a fusion-bonded state to form insulating layer 13a (refer to FIG. 5C) in wiring layer 12.

Subsequently, as shown in FIG. 5C, through-hole 15a penetrating through laminated body 15 is formed and a plated layer is formed on the inner surface of through-hole 15a to produce interlayer wiring part 16 connecting wiring pattern 3 of core layer 1 to copper foil 14 of wiring layer 12 (interlayer wiring step). Further, copper foil 14 of wiring layer 12 is patterned to form wiring pattern 14a (circuit forming step).

Herewith, component built-in circuit substrate 17 completes that is formed by laminating plural wiring layers (core layer 1 and wiring layer 12 in this embodiment) including core layer 1, where chip component 7 is mounted on core layer 1. In this component built-in circuit substrate 17, terminal 7a of chip component 7 is solder-joined to connecting electrodes 3a composing wiring pattern 3 formed on at least one surface of core layer 1 through solder part 6aa. Wiring layer 12 has a structure in which wiring pattern 14a is formed on insulating layer 13a with its prepreg 13 solidified.

Further, component built-in circuit substrate 17 has resist 4 positioned halfway between a pair of electrodes 3a and is formed in a range corresponding to width b of electrode 3a in core layer 1. Component built-in circuit substrate 17 additionally has sealing resin part 6bb filling a gap between core layer 1 and the bottom surface of chip component 7; covering resist 4 and solder part 6aa. Substrate 17 further has component fixing layer 11b formed by solidifying prepreg 11 laminated on top surface 2a (one surface) of core layer 1; fixing chip component 7 and sealing resin part 6bb at their peripheries. Substrate 17 further has wiring layer 12, which is one of the plural wiring layers, as a surface layer formed on the front surface of component fixing layer 11b. Substrate 17 further has interlayer wiring part 16 connecting wiring pattern 3 of core layer 1 to wiring pattern 14a of wiring layer 12 (i.e. surface layer).

Component built-in circuit substrate 17 thus produced becomes a target of mounting further components, where another electronic component is mounted onto wiring layer 12 (surface layer) by solder-joining to complete a mounted substrate. In other words, another electronic component is joined to the front surface of wiring layer 12 through another solder part. Further, a gap between the front surface of wiring layer 12 and the bottom surface of another electronic component has another sealing resin part formed therein so as to cover another solder part and resist.

In this process of producing a mounted substrate, the entire component built-in circuit substrate 17 is reheated when solder-joined. This heating causes solder part 6aa solder-joining electrode 3a to terminal 7a in core layer 1 to melt. At this moment, a gap between the bottom surface of chip component 7 and core layer 1 is filled with sealing resin part 6*bb*, and thus melted solder of solder part 6*aa* is prevented from flowing.

At this moment, if the gap is filled with sealing resin part 6*bb* at a low degree, and if a void (a part where the gap between the bottom surface of chip component 7 and core layer 1 is not filled with sealing resin part 6*bb*) is present, melted solder of solder part 6*aa* can flow in the direction of electrodes 3*a* facing each other through the void. In such a case, however, in this embodiment, resist 4 is formed halfway between a pair of electrodes 3*a*, which blocks a flow of melted solder of solder part 6*aa* in the direction of electrodes 3*a* facing each other. Herewith, a defect can be reliably prevented that is caused by a short circuit as a result that melted solder of solder part 6*aa* forms a solder bridge between electrodes 3*a* facing each other when reheating.

Here, still another electronic component may be joined to wiring pattern 5 of the back surface of core layer 1 through still another solder part similarly to this embodiment. In this case, another electrode composing wiring pattern 5 on the back surface of core layer 1 is to be formed, and a sealing resin part is to be formed in a gap between the back surface of core layer 1 and the bottom surface of the still other electronic component.

What is claimed is:

1. A method of producing a component built-in circuit substrate, comprising:
   a step of feeding solder-joining material produced from thermosetting resin containing solder particles, to a pair of connecting electrodes forming a wiring pattern, that are on a front surface of a core layer and have a resist spaced away from each of the pair of connecting electrodes;
   a step of then fastening a pair of connecting terminals of an electronic component having the pair of connecting terminals to the pair of electrodes through the solder-joining material, respectively, to mount the electronic component on the core layer;
   a step of then forming a sealing resin part on all of a top surface of the resist which is above said core layer and covering a solder part by heating the core layer to melt and solidify the solder particles to form the solder part joining between the electrodes and the connecting terminals, and by thermally hardening the thermosetting resin to fill a gap between a bottom surface of the electronic component and a front surface of the core layer;
   a step of then forming a component fixing layer fixing the electronic component, on a front surface of the core layer;
   a step of then providing a wiring layer with another wiring pattern formed thereon on a front surface of the component fixing layer; and
   a step of then forming an interlayer wiring part connecting the wiring pattern of the core layer to the other wiring pattern of the wiring layer.

2. The method of producing a component built-in circuit substrate of claim 1, further comprising a step of roughening the wiring pattern between the step of forming the sealing resin part and the step of forming the component fixing layer on a front surface of the core layer.

3. The method of producing a component built-in circuit substrate of claim 1, wherein the resist is formed in a range corresponding to the pair of electrodes.

4. The method of producing a component built-in circuit substrate of claim 1, wherein the component fixing layer is formed by laminating prepreg on a front surface of the core layer and then by solidifying the prepreg.

5. The method of producing a component built-in circuit substrate of claim 1, wherein the wiring layer is formed by solidifying a prepreg to form an insulating layer and then by forming the other wiring pattern on the insulating layer.

6. The method of producing a component built-in circuit substrate of claim 1, wherein the wiring layer is formed by joining another electronic component to the other wiring pattern by another solder part.

7. The method of producing a component built-in circuit substrate of claim 1, wherein the core layer has a still other wiring pattern formed on a back surface thereof, and is formed by joining a still other electronic component to the still other wiring pattern by a still other solder part.

* * * * *